(12) United States Patent
Iwata et al.

(10) Patent No.: US 9,646,915 B2
(45) Date of Patent: May 9, 2017

(54) HEAT DISSIPATION DEVICE AND SEMICONDUCTOR DEVICE

(71) Applicants: KABUSHIKI KAISHA TOYOTA JIDOSHOKKI, Kariya-shi, Aichi-ken (JP); Kyocera Corporation, Kyoto-shi, Kyoto (JP)

(72) Inventors: Yoshitaka Iwata, Kariya (JP); Shogo Mori, Kariya (JP); Daizo Kamiyama, Kariya (JP); Kenji Tsubokawa, Kyoto (JP); Shinichi Soga, Kyoto (JP); Hideo Tanimoto, Kyoto (JP)

(73) Assignee: Kyocera Corporation, Kariya-shi (JP)

( * ) Notice: Subject to any disclaimer, the term of this patent is extended or adjusted under 35 U.S.C. 154(b) by 10 days.

(21) Appl. No.: 14/414,728

(22) PCT Filed: Jul. 18, 2013

(86) PCT No.: PCT/JP2013/069515
§ 371 (c)(1),
(2) Date: Jan. 14, 2015

(87) PCT Pub. No.: WO2014/014054
PCT Pub. Date: Jan. 23, 2014

(65) Prior Publication Data
US 2015/0221579 A1    Aug. 6, 2015

(30) Foreign Application Priority Data

Jul. 18, 2012 (JP) ................. 2012-159734
Dec. 27, 2012 (JP) ................. 2012-284011
Dec. 27, 2012 (JP) ................. 2012-284012

(51) Int. Cl.
*H01L 23/473* (2006.01)
*H01L 23/467* (2006.01)
(Continued)

(52) U.S. Cl.
CPC ........ *H01L 23/473* (2013.01); *H01L 23/3735* (2013.01); *H01L 23/467* (2013.01);
(Continued)

(58) Field of Classification Search
CPC ............................ H01L 23/467; H01L 23/473
See application file for complete search history.

(56) References Cited

U.S. PATENT DOCUMENTS 4,814,030 A    3/1989   Dubuisson et al.
6,480,514 B1   11/2002  Lorenzen et al.
(Continued)

FOREIGN PATENT DOCUMENTS

DE    4315580 A1      11/1994
JP    2001-160649 A   6/2001
(Continued)

OTHER PUBLICATIONS

International Search Report of PCT/JP2013/069515 dated Oct. 22, 2013.
(Continued)

*Primary Examiner* — Phat X Cao
(74) *Attorney, Agent, or Firm* — Sughrue Mion, PLLC

(57) ABSTRACT

In a laminating direction of first to fifth ceramic sheets, a first slit and a second slit are positioned closer to a first mounting section and a second mounting section than a first communication hole, a second communication hole, a third communication hole and a fourth communication hole. Moreover, an overlapping section where each first slit and the first communication hole overlap, and an overlapping section where each second slit and the third communication hole overlap, are positioned in the vicinity of an area where the first mounting section and the second mounting section are disposed when viewed from the laminating direction of the first to fifth ceramic sheets.

12 Claims, 11 Drawing Sheets

(51) Int. Cl.
*H01L 23/373* (2006.01)
*H01L 23/00* (2006.01)

(52) U.S. Cl.
CPC .......... *H01L 23/3731* (2013.01); *H01L 24/29* (2013.01); *H01L 24/32* (2013.01); *H01L 2224/291* (2013.01); *H01L 2224/32227* (2013.01); *H01L 2224/32238* (2013.01); *H01L 2224/83424* (2013.01); *H01L 2224/83447* (2013.01)

(56) References Cited

U.S. PATENT DOCUMENTS

2010/0090336 A1* 4/2010 Yoshida ................ H01L 23/473
257/717
2013/0039010 A1 2/2013 Mori et al.

FOREIGN PATENT DOCUMENTS

| | | |
|---|---|---|
| JP | 2004-095599 A | 3/2004 |
| JP | 2007-012719 A | 1/2007 |
| JP | 2007-184479 A | 7/2007 |
| WO | 2011/136362 A1 | 11/2011 |

OTHER PUBLICATIONS

Communication dated Mar. 14, 2016 from the European Patent Office issued in corresponding Application No. 13820186.8.
International Preliminary Report on Patentability dated Jan. 29, 2015 from the International Bureau in counterpart Application No. PCT/JP2013/069515.

* cited by examiner

HEAT DISSIPATION DEVICE AND SEMICONDUCTOR DEVICE

CROSS REFERENCE TO RELATED APPLICATIONS

This is a National Stage of International Application No. PCT/JP2013/069515 filed Jul. 18, 2013, claiming priority based on Japanese Patent Application No. 2012-159734 filed Jul. 18, 2012, Japanese Patent Application No. 2012-284011 filed Dec. 27, 2012, and Japanese Patent Application No. 2012-284012 filed Dec. 27, 2012, the contents of all of which are incorporated herein by reference in their entirety.

FIELD OF THE INVENTION

The present invention relates to a heat dissipation device, formed by stacking ceramic sheets, and a semiconductor device, formed by mounting a metal plate to which a semiconductor element is coupled on a heat dissipation device.

BACKGROUND OF THE INVENTION

For example, patent document 1 discloses this type of a heat dissipation device. The heat dissipation device of patent document 1 is formed by baking a lamination in which a plurality of ceramic sheets are stacked. The ceramic sheets include a ceramic sheet having a plurality of slits, which are elements of a coolant passage, and a ceramic sheet having a communication passage that communicates the coolant passage and the exterior. A metal plate to which a semiconductor element is coupled is joined with a heat dissipation device to form a semiconductor device. Heat is transmitted from the semiconductor element to the heat dissipation device through the metal plate and dissipated to the coolant flowing through the coolant passage. This cools the semiconductor element.

PRIOR ART DOCUMENT

Patent Document

Patent Document 1: International Publication No. WO2011/136362

SUMMARY OF THE INVENTION

In such a heat dissipation device, it is desired that the performance for cooling a cooling subject such as a semiconductor element be further improved.

It is an object of the present disclosure to provide a heat dissipation device and a semiconductor device that can improve the performance for cooling a cooling subject.

One aspect of a heat dissipation device of the present disclosure includes a base body formed by stacking a plurality of ceramic sheets, a coolant passage located in the base body and through which coolant flows, at least one mounting portion defined in a first surface of the base body as a location where a cooling subject is mounted, a slit formation layer formed by at least one of the ceramic sheets, and a communication passage formation layer formed by at least one of the ceramic sheets. The slit formation layer includes a plurality of slits that form a portion of the coolant passage. The slits are formed to be at least partially overlapped with a region that includes the mounting portion as viewed from a stacking direction of the ceramic sheets. The communication passage formation layer forms a portion of the coolant passage and includes a communication passage that communicates the slits. The slits are located toward the mounting portion from the communication passage in the stacking direction of the ceramic sheets. An overlapping portion of the slits and the communication passage is located proximate to a region where the mounting portion is located as viewed from the stacking direction.

Another aspect of the heat dissipation device of the present disclosure includes a base body formed by stacking a plurality of ceramic members, a coolant passage located in the base body, and at least one mounting portion defined in a first surface of the base body as a location where a cooling subject is mounted. The coolant passage includes an underneath-lying passage that is formed underneath the mounting portion, a supply passage in communication with an upstream side of the underneath-lying passage in a direction coolant flows, a discharge passage in communication with a downstream side of the underneath-lying passage in the direction the coolant flows, and an expulsion passage located between the supply passage and the discharge passage. The supply passage supplies the coolant to the underneath-lying passage. The discharge passage discharges the coolant from the underneath-lying passage. The expulsion passage expels the coolant to the underneath-lying passage from a vertically lower side toward a vertically upper side.

One aspect of a semiconductor device of the present disclosure includes the above heat dissipation device, a metal plate mounted on the mounting portion of the heat dissipation device, and a semiconductor element coupled to the metal plate.

DETAILED DESCRIPTION OF THE PREFERRED EMBODIMENTS

First Embodiment

A first embodiment of the present invention will now be described with reference to FIGS. 1 to 6.

Figure 1:
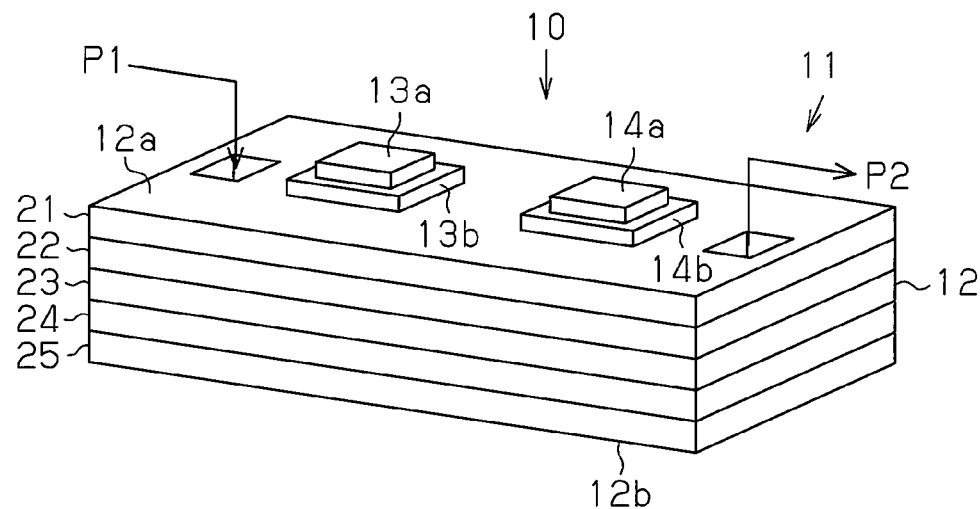
FIG. 1 is a perspective view of a first embodiment of a semiconductor device.

A semiconductor device 10 shown in FIG. 1 is formed by mounting a metal plate 13b to which a semiconductor element 13a is coupled and a metal plate 14b to which a semiconductor element 14a is coupled on one surface 12a (first surface) of a base body 12 of a heat dissipation device 11. The metal plates 13b and 14b, which function as wiring layers and joining layers, are formed from pure aluminum (e.g., 1000 series aluminum, which is pure aluminum for industrial use) or copper. For example, insulated gate bipolar transistors (IGBTs) or diodes are used as the semiconductor elements 13a and 14a. The semiconductor elements 13a and 14a are joined with the metal plates 13b and 14b by performing metallic joining, for example, soldering or brazing. Also, the metal plates 13b and 14b are joined with the heat dissipation device 11 by performing metallic joining, for example, soldering or brazing. In this manner, the metal plates 13b and 14b are mounted on the first surface 12a of the base body 12.

Figure 2:
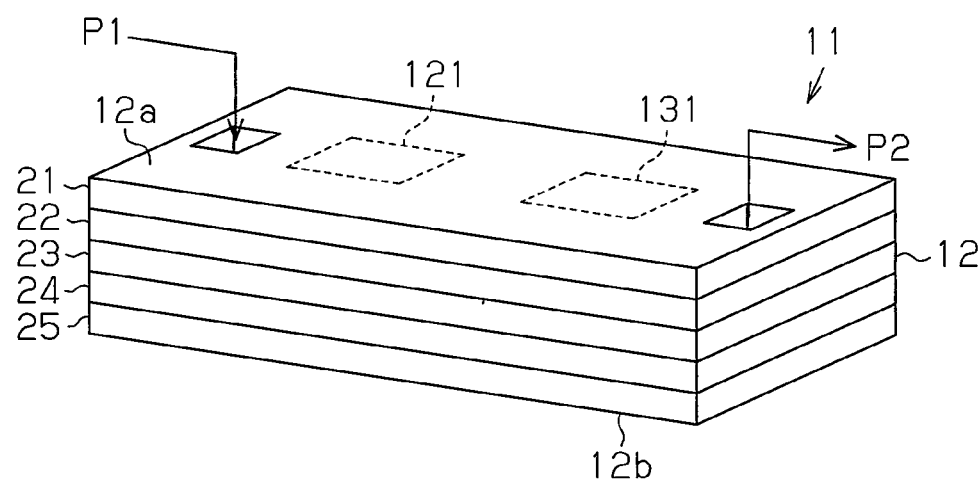
FIG. 2 is a perspective view of a heat dissipation device of the semiconductor device of FIG. 1.

As shown in FIG. 2, in the first surface 12a of the base body 12, locations where the metal plates 13b and 14b are mounted (indicated by broken lines in FIG. 2) are respectively a first mounting portion 121 and a second mounting portion 131, which function as mounting portions on which the metal plates 13b and 14b are mounted. That is, a plurality of the mounting portions (two in the first embodiment) are arranged side by side on the first surface 12a of the base body 12.

The base body 12 is formed by stacking a plurality of ceramic sheets (five sheets in the first embodiment). The base body 12 is baked to form the heat dissipation device 11. Aluminum oxide, silicon nitride, silicon carbide, aluminum nitride, alumina zirconium, or the like, is used as the material of the ceramic. Preferably, a ceramic material has high water resistance when water cooling is employed to cool the heat dissipation device 11.

Figure 3:
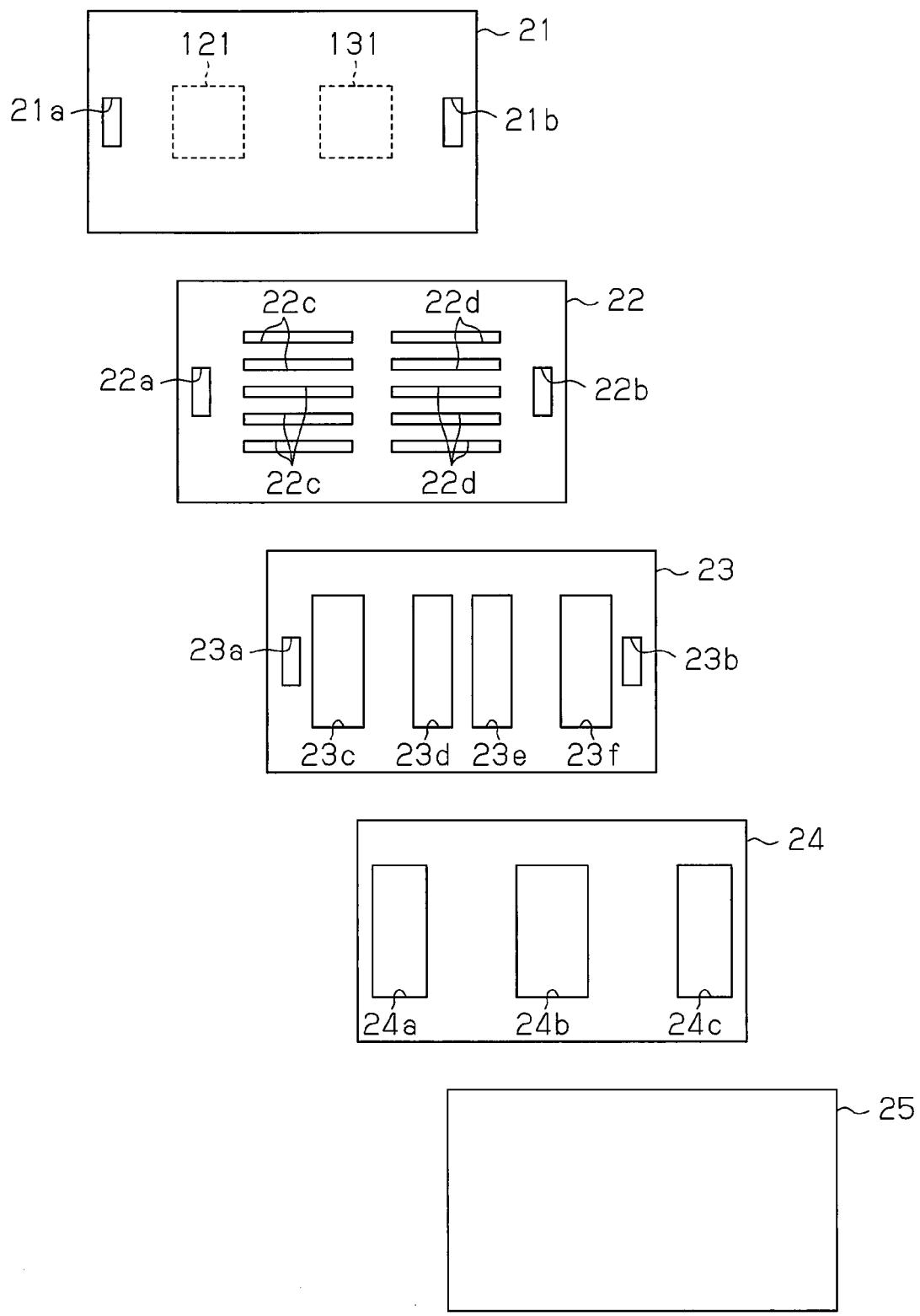
FIG. 3 is a plan view of a plurality of ceramic sheets, which are elements of the heat dissipation device of FIG. 2.

As shown in FIG. 3, the heat dissipation device 11 of the first embodiment includes first to fifth ceramic sheets 21, 22, 23, 24, and 25 as elements serving as ceramic sheets. In the description, hereafter, in the heat dissipation device 11, the first ceramic sheet 21 is located at the upper side, and the fifth ceramic sheet 25 is located at the lower side. The first ceramic sheet 21 forms a top plate portion of the heat dissipation device 11 and includes a surface (upper surface) defining the first surface 12a of the base body 12. A coolant supply hole 21a and a coolant discharge hole 21b extend through the first ceramic sheet 21. The coolant supply hole 21a and the coolant discharge hole 21b have the same open area. The coolant supply hole 21a is connected to a supply pipe P1 (shown in FIGS. 1 and 2) that supplies a coolant to the heat dissipation device 11. The coolant discharge hole 21b is connected to a discharge pipe P2 (shown in FIGS. 1 and 2) that discharges the coolant out of the heat dissipation device 11 to the exterior.

A first coolant inlet hole 22a extends through the second ceramic sheet 22. The first coolant inlet hole 22a is located at a position where the first coolant inlet hole 22a is overlapped with the coolant supply hole 21a as viewed from a stacking direction of the first to fifth ceramic sheets 21, 22, 23, 24, and 25. A first coolant outlet hole 22b extends through the second ceramic sheet 22. The first coolant outlet hole 22b is located at a position where the first coolant outlet hole 22b is overlapped with the coolant discharge hole 21b as viewed from the stacking direction of the first to fifth ceramic sheets 21, 22, 23, 24, and 25 (hereafter, may be simply referred to as a stacking direction A). The first coolant inlet hole 22a and the first coolant outlet hole 22b are located in symmetric positions. The first coolant inlet hole 22a and the first coolant outlet hole 22b have the same open area.

The second ceramic sheet 22 also includes a plurality of first slits 22c, which serve as slits, between the first coolant inlet hole 22a and the first coolant outlet hole 22b. Each first slit 22c extends through the second ceramic sheet 22 and extends straight in the second ceramic sheet 22 from a position that is closer to the first coolant inlet hole 22a toward a central portion of the second ceramic sheet 22. The first slits 22c have the same length. The first slits 22c have the same open area. The first slits 22c are at least partially located underneath the first mounting portion 121 (metal plate 13b and semiconductor element 13a). That is, the first slits 22c are at least partially overlapped with the first mounting portion 121 as viewed from the stacking direction A.

The second ceramic sheet 22 also includes a plurality of second slits 22d, which serve as slits, between the first coolant inlet hole 22a and the first coolant outlet hole 22b. Each second slit 22d extends through the second ceramic sheet 22 and extends straight in the second ceramic sheet 22 from a position that is closer to the first coolant outlet hole 22b toward the central portion of the second ceramic sheet 22. The second slits 22d have the same length. The second slits 22d have the same open area. The second slits 22d are at least partially located underneath the second mounting portion 131 (metal plate 14b and semiconductor element 14a). That is, the second slits 22d are at least partially overlapped with the second mounting portion 131 as viewed from the stacking direction A.

A second coolant inlet hole 23a extends through the third ceramic sheet 23. The second coolant inlet hole 23a is located in a position where the second coolant inlet hole 23a is overlapped with the first coolant inlet hole 22a as viewed from the stacking direction A. A second coolant outlet hole 23b extends through the third ceramic sheet 23. The second coolant outlet hole 23b is located in a position where the second coolant outlet hole 23b is overlapped with the first coolant outlet hole 22b as viewed from the stacking direction A. The second coolant inlet hole 23a and the second coolant outlet hole 23b have the same open area.

The third ceramic sheet 23 also includes a first communication hole 23c, which extends in a direction orthogonal to the extending direction of each first slit 22c. The first communication hole 23c is partially overlapped with each first slit 22c at one end that is located toward the first coolant inlet hole 22a as viewed from the stacking direction A. This communicates each first slit 22c and the first communication hole 23c. Additionally, the third ceramic sheet 23 includes a second communication hole 23d at a position closer to the second coolant outlet hole 23b than the first communication hole 23c. The second communication hole 23d extends in the direction orthogonal to the extending direction of each first slit 22c. The second communication hole 23d is partially overlapped with each first slit 22c at the other end, which is located toward the first coolant outlet hole 22b, as viewed from the stacking direction A. This communicates each first slit 22c and the second communication hole 23d.

The third ceramic sheet 23 also includes a third communication hole 23e, which extends in a direction orthogonal to the extending direction of each second slit 22d. The third communication hole 23e is partially overlapped with each second slit 22d at one end that is located toward the first coolant inlet hole 22a as viewed from the stacking direction A. This communicates each second slit 22d and the third communication hole 23e. Additionally, the third ceramic sheet 23 includes a fourth communication hole 23f at a position closer to the second coolant outlet hole 23b than the third communication hole 23e. The fourth communication hole 23f extends in the direction orthogonal to the extending direction of each second slit 22d. The fourth communication hole 23f is partially overlapped with each second slit 22d at the other end, which is located toward the first coolant outlet hole 22b, as viewed from the stacking direction A. This communicates each second slit 22d and the fourth communication hole 23f.

The fourth ceramic sheet 24 includes a first through hole 24a, a second through hole 24b, and a third through hole 24c. The first through hole 24a is overlapped with the second coolant inlet hole 23a and a portion of the first communication hole 23c as viewed from the stacking direction A. This communicates the second coolant inlet hole 23a and the first communication hole 23c. The second through hole 24b is overlapped with a portion of the second communication hole 23d and a portion of the third communication hole 23e as viewed from the stacking direction A. This communicates the second communication hole 23d and the third communication hole 23e. The third communication hole 24c is overlapped with a portion of the fourth communication hole 23f and the second coolant outlet hole 23b as viewed from the stacking direction A. This communicates the fourth communication hole 23f and the second coolant outlet hole 23b. The fifth ceramic sheet 25 forms a bottom plate portion of the heat dissipation device 11 and includes a surface (lower surface) defining a second surface 12b of the base body 12. That is, the first surface 12a and the second surface 12b are located at opposite sides of the base body 12.

Figure 4:
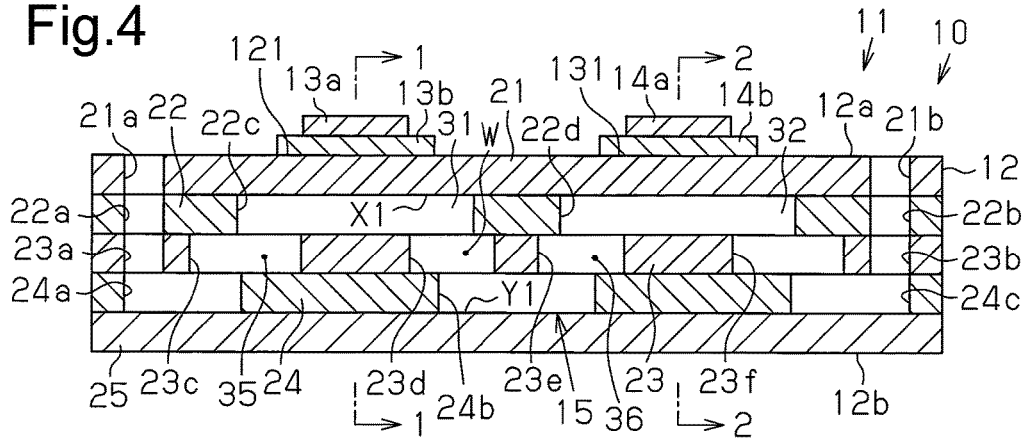
FIG. 4 is a cross-sectional view of the semiconductor device of FIG. 1.

As shown in FIG. 4, the base body 12 of the heat dissipation device 11 is formed by sequentially stacking the fourth ceramic sheet 24, the third ceramic sheet 23, the second ceramic sheet 22, and the first ceramic sheet 21 on the fifth ceramic sheet 25. The interior of the base body 12 includes the coolant supply hole 21a, the first coolant inlet hole 22a, the second coolant inlet hole 23a, the first through hole 24a, the first communication hole 23c, each first slit 22c, the second communication hole 23d, the second through hole 24b, the third communication hole 23e, each second slit 22d, the fourth communication hole 23f, the third through hole 24c, the second coolant outlet hole 23b, the first coolant outlet hole 22b, and the coolant discharge hole 21b, which form a coolant passage 15 through which a coolant flows. The coolant supply hole 21a and the coolant discharge hole 21b open in the first surface 12a of the base body 12.

The second communication hole 23d, the second through hole 24b, and the third communication hole 23e form a portion of the coolant passage 15 that is located between the first mounting portion 121 and the second mounting portion 131. That is, the second communication hole 23d, the second through hole 24b, and the third communication hole 23e form a portion of the coolant passage 15 that extends from the first mounting portion 121 toward the second surface 12b and extends from the second surface 12b toward the second mounting portion 131.

In the first embodiment, the second ceramic sheet 22 corresponds to a slit formation layer that includes the first slits 22c and the second slits 22d, which form a portion of the coolant passage 15. The first communication hole 23c corresponds to a communication passage that is overlapped with each first slit 22c at a portion closer to the first coolant inlet hole 22a and communicates with each first slit 22c. The second communication hole 23d corresponds to a communication passage that is overlapped with each first slit 22c at a portion closer to the first coolant outlet hole 22b and communications with each first slit 22c. The third communication hole 23e corresponds to a communication passage that is overlapped with each second slit 22d at a portion closer to the first coolant inlet hole 22a and communicates with each second slit 22d. The fourth communication hole 23f corresponds to a communication passage that is overlapped with each second slit 22d at a portion closer to the first coolant outlet hole 22b and communicates with each second slit 22d. The third ceramic sheet 23 corresponds to a communication passage formation layer that includes the first communication hole 23c, the second communication hole 23d, the third communication hole 23e, and the fourth communication hole 23f, which correspond to the communication passages.

The first slits 22c and the second slits 22d are located toward the first mounting portion 121 and the second mounting portion 131 from the first communication hole 23c, the second communication hole 23d, the third communication hole 23e, and the fourth communication hole 23f in the stacking direction A.

Figure 6:
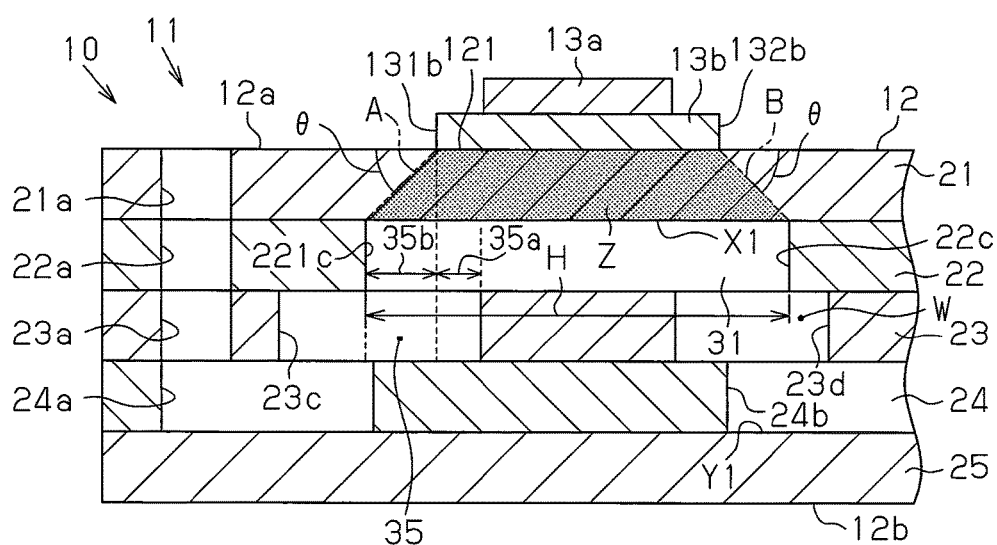
FIG. 6 is a partially enlarged cross-sectional view of the semiconductor device of FIG. 4.

In the heat dissipation device 11, the second communication hole 23d is continuous to the first slit 22c at a downstream side of the coolant flow, and the second through hole 24b is continuous to the second communication hole 23d. This forms an extension passage W that extends from the first surface 12a to the second surface 12b of the base body 12. As shown in FIGS. 4 and 6, the extension passage W includes a passage surface X1 and a passage surface Y1 that are opposed in the stacking direction of the first to fifth ceramic sheets 21 to 25. The passage surface X1 is a portion of a passage formed by the first slit 22c, which is located closer to the first surface 12a of the base body 12. The passage surface Y1 is a portion of a passage formed by the second through hole 24b, which is located closer to the second surface 12b.

The passage surface X1 is formed by a surface of the first ceramic sheet 21, which is located above the second ceramic sheet 22. The passage surface Y1 is formed by a surface of the fifth ceramic sheet 25, which is located below the fourth ceramic sheet 24. That is, a passage formed by the first slit 22c forms the coolant passage 15 that is located on the uppermost position in the stacking direction. The passage surface X1 corresponds to an upper surface of the passage. A passage formed by the second through hole 24b forms the coolant passage 15 that is located at the lowermost position in the stacking direction. The passage surface Y1 corresponds to a lower surface of the passage.

Figure 5A:
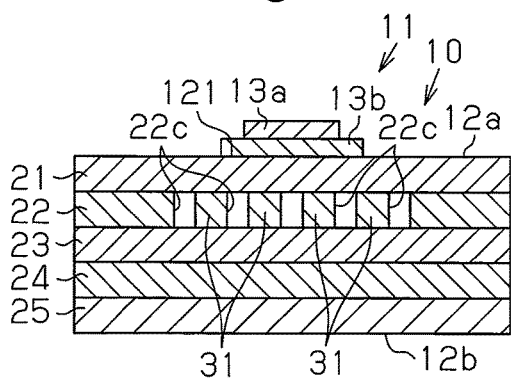
FIG. 5A is a cross-sectional view of FIG. 4 taken along line 1-1.
Figure 5B:
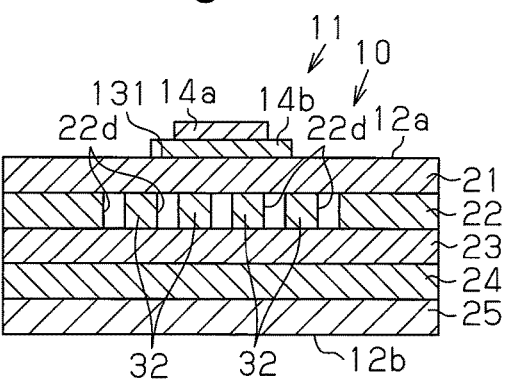
FIG. 5B is a cross-sectional view of FIG. 4 taken along line 2-2.

As shown in FIG. 5A, a first fin 31 is located between adjacent ones of the first slits 22c. As shown in FIG. 5B, a second fin 32 is located between adjacent ones of the second slits 22d.

As shown in FIG. 6, the length H of the first fin 31 (length of the first slit 22c) is set to be within a region Z (dotted region in FIG. 6) as viewed from the stacking direction A. In a cross-section of the first ceramic sheet 21, the region Z is located between straight lines A and B. The straight lines A and B extend from opposite ends 131b and 132b of the metal plate 13b at an angle θ of 45° relative to the first surface 12a of the base body 12. The angle θ of the straight lines A and B relative to the first surface 12a of the base body 12 only needs to be within 30° to 60°. The region Z, which is located between the straight lines A and B, forms a heat transmission region where the heat generated by the semiconductor element 13a is transmitted to the heat dissipation device 11 through the metal plate 13b.

In the first embodiment, a portion of the first communication hole 23c that corresponds to the region Z as viewed from the stacking direction A serves as an overlapping portion 35 of each first slit 22c and the first communication hole 23c. Thus, the overlapping portion 35 is located in the heat transmission region, where the heat generated by the semiconductor element 13a is transmitted to the heat dissipation device 11 through the metal plate 13b. That is, the overlapping portion 35 is located proximate to a region where the first mounting portion 121 is located as viewed from the stacking direction A. The overlapping portion 35 is located toward an inner side of the first slit 22c from one end 221c of each first slit 22c that is closer to the first coolant inlet hole 22a. The same description can be given for the length of the second fin 32 (length of the second slit 22d) and an overlapping portion 36 of each second slit 22d and the third communication hole 23e as the length H of the first fin 31 and the overlapping portion 35 of each first slit 22c and the first communication hole 23c. Thus, a detailed description will not be given.

As shown in FIG. 6, in a cross-sectional view of the heat dissipation device 11, the overlapping portion 35 includes a first overlapping portion 35a, which is located underneath the first mounting portion 121, and a second overlapping portion 35b, which excludes the first overlapping portion 35a. The length of the second overlapping portion 35b is greater than the length of the first overlapping portion 35a. In this case, the phrase "the length of the second overlapping portion 35b is greater than the length of the first overlapping portion 35a" means, in the cross-sectional view of the heat dissipation device 11, the second overlapping portion 35b extends toward the first coolant inlet hole 22a, which results in the length of the second overlapping portion 35b being greater than the length of the first overlapping portion 35a. Although the first mounting portion 121 has been described here, the second mounting portion 131 has the same form. Here, the phrase of "underneath a mounting portion" refers to a region that is located toward the coolant passage 15 from the mounting portion and corresponds to a region that is overlapped with the mounting portion as viewed from the stacking direction A.

The operation of the first embodiment will now be described.

The coolant supplied from the coolant supply source flows from the supply pipe P1 to each first slit 22c through the coolant supply hole 21a, the first coolant inlet hole 22a, the second coolant inlet hole 23a, the first through hole 24a, and the first communication hole 23c. In this case, when the coolant flows from the first communication hole 23c to each first slit 22c, the coolant is expelled from the first communication hole 23c into each first slit 22c and directed toward the first mounting portion 121 (semiconductor element 13a and metal plate 13b). This generates a jet flow in the coolant flowing from the first communication hole 23c to each first slit 22c and agitates the coolant flowing through each first slit 22c. As a result, the heat, which is transmitted from the semiconductor element 13a to the heat dissipation device 11 (each first fin 31) through the metal plate 13b, is dissipated to the coolant flowing through each first slit 22c more effectively than when, for example, the coolant flows through each first slit 22c along the first mounting portion 121 (first surface 12a of the base body 12) after flowing along the first surface 12a. This improves the performance for cooling the semiconductor element 13a. In the first embodiment, the semiconductor element 13a corresponds to a first cooling subject.

Also, the coolant flows from each first slit 22c to each second slit 22d through the second communication hole 23d, the second through hole 24b, and the third communication hole 23e. In this case, when the coolant flows from the third communication hole 23e to each second slit 22d, the coolant is expelled from the third communication hole 23e into each second slit 22d to be directed toward the second mounting portion 131 (semiconductor element 14a and metal plate 14b). This generates a jet flow in the coolant flowing from the third communication hole 23e to each second slit 22d and agitates the coolant flowing through each second slit 22d. As a result, the heat, which is transmitted from semiconductor element 14a to the heat dissipation device 11 (each second fin 32) through the metal plate 14b, is dissipated to the coolant flowing through each second slit 22d more effectively then when, for example, the coolant flows through each second slit 22d along the second mounting portion 131 (first surface 12a of the base body 12) after flowing along the first surface 12a. This improves the performance for cooling the semiconductor element 14a. In the first embodiment, the semiconductor element 14a corresponds to a second cooling subject.

The coolant flows through each second slit 22d and is discharged from the discharge pipe P2 and out of the heat dissipation device 11 through the fourth communication hole 23f, the third through hole 24c, the second coolant outlet hole 23b, the first coolant outlet hole 22b, and the coolant discharge hole 21b.

Accordingly, the first embodiment has the advantages described below.

(1) The first slit 22c and the second slit 22d are located toward the first mounting portion 121 and the second mounting portion 131 from the first communication hole 23c, the second communication hole 23d, the third communication hole 23e, and the fourth communication hole 23f in the stacking direction A. The overlapping portion 35 of each first slit 22c and the first communication hole 23c and the overlapping portion 36 of each second slit 22d and the third communication hole 23e are respectively located proximate to regions where the first mounting portion 121 and the second mounting portion 131 are arranged. Thus, the coolant flowing from the first communication hole 23c to each first slit 22c may be directed toward the first mounting portion 121. The coolant flowing from the third communication hole 23e to each second slit 22d may be directed toward the second mounting portion 131. This cools the semiconductor elements 13a and 14a more effectively than when, for example, the coolant flows through each first slit 22c and each second slit 22d along the first mounting portion 121 and the second mounting portion 131. Thus, the performance for cooling the semiconductor elements 13a and 14a may be improved.

(2) In the region Z corresponding to the first mounting portion 121 on which a cooling subject is mounted, that is, the region Z serving as the heat transmission region described above, the length of the second overlapping portion 35b is greater than the length of the first overlapping portion 35a. When the coolant enters a coolant passage of a thin slit, turbulent flow is generated. However, there is a time-lag until the turbulent flow contributes to a thermal exchange. The length of the second overlapping portion 35b is greater than the length of the first overlapping portion 35a. This allows the coolant to cool the heat transmission region from a portion located at the upstream side and effectively cools the semiconductor element 13a. Thus, the performance for cooling the semiconductor element 13a may be improved. In the same manner as the first mounting portion 121, when the second mounting portion 131 and a third mounting portion 171 which will be described later, have the same form, the same advantage may be obtained even when a plurality of semiconductor elements are mounted on each mounting portion.

(3) A portion of the coolant passage 15 that is formed by the second communication hole 23d, the second through hole 24b, and the third communication hole 23e extends from the first mounting portion 121 in a direction toward the second surface 12b and extends from the second surface 12b in a direction toward the second mounting portion 131. Thus, the flow of the coolant flowing through the coolant passage 15 may be directed toward the first mounting portion 121 and the second mounting portion 131. Therefore, when the metal plate 13b, to which the semiconductor element 13a is coupled, is mounted on the first mounting portion 121 and the metal plate 14b, to which the semiconductor element 14a is coupled, is mounted on the second mounting portion 131, the semiconductor elements 13a and 14a can be effectively cooled and the performance for cooling the semiconductor elements 13a and 14a may be improved.

(4) The first communication hole 23c and the first slit 22c, and the third communication hole 23e and the second slit 22d, are each directed to the corresponding mounting portion in a stepped manner. The stepped coolant passage 15 can generate a jet flow and a turbulent flow in the coolant. This effectively cools each first slit 22c from the end 221c, which is located at the upstream side, and each second slit 22d from an end of the passage surface X1 that is located at the upstream side. Thus, the cooling performance may be improved. This reduces the size of the heat dissipation device 11 without the need to lengthen the passage to improve the cooling performance.

(5) The coolant supply hole 21a and the coolant discharge hole 21b open in the first surface 12a of the base body 12. This allows the first surface 12a of the base body 12 to be connected to the supply pipe P1, which is used to supply the coolant, and the discharge pipe P2, which is used to discharge the coolant. Thus, components needed for the heat dissipation device 11 may be collectively located at the side of the first surface 12a of the base body 12. This reduces the size of the heat dissipation device 11.

(6) The length H of the first fin 31 (length of the first slit 22c) is set to be within the region Z as viewed from the stacking direction A. The region Z is located between the straight lines A and B, which extend from the opposite ends 131b and 132b of the metal plate 13b at an angle θ of 45° relative to the first surface 12a of the base body 12. In this case, the length H of the first fin 31 may be the minimum length needed for the heat dissipation of the semiconductor element 13a. That is, the length of the first slit 22c can be minimized. This limits pressure loss of the coolant flowing through the first slit 22c as compared to when the first slit 22c is formed to extend beyond the region Z to a position outside the region Z.

(7) In the extension passage W, the passage surfaces X1 and Y1 are opposed to each other in the stacking direction. This reduces portions that decrease the area of the passage. Thus, the pressure loss of the coolant may be decreased. When the passage surfaces X1 and Y1 are opposed to each other, the extension passage W becomes almost straight in the stacking direction A. Thus, the reduction of steps in the extension passage W limits expansion of the coolant passage 15 in the lateral direction. This decreases the size of the heat dissipation device 11.

The first embodiment may be modified as follows.

Figure 7:
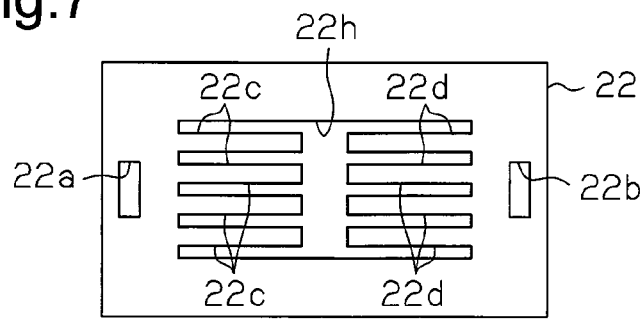
FIG. 7 is a plan view of another embodiment of a ceramic sheet.
Figure 8:
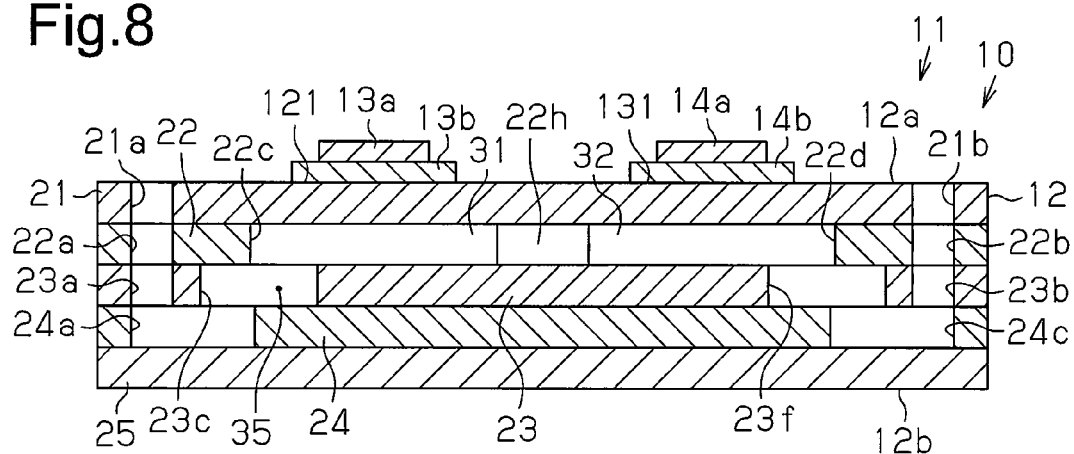
FIG. 8 is a cross-sectional view of a semiconductor device that includes the ceramic sheet of FIG. 7.

As shown in FIG. 7, the second ceramic sheet 22 may include a communication portion 22h that communicates each first slit 22c and each second slit 22d. As shown in FIG. 8, the second communication hole 23d, the second through hole 24b, and the third communication hole 23e may be removed. In this case, the coolant may flow from each first slit 22c to each second slit 22d through the communication portion 22h only in the second ceramic sheet 22. This smoothly flows the coolant compared to when the coolant flows from each first slit 22c to each second slit 22d through the second communication hole 23d, the second through hole 24b, and the third communication hole 23e. Thus, the pressure loss of the coolant may be limited. In this case, preferably, a metal plate including a semiconductor element that should be cooled the most is mounted on the first mounting portion 121.

Figure 9:
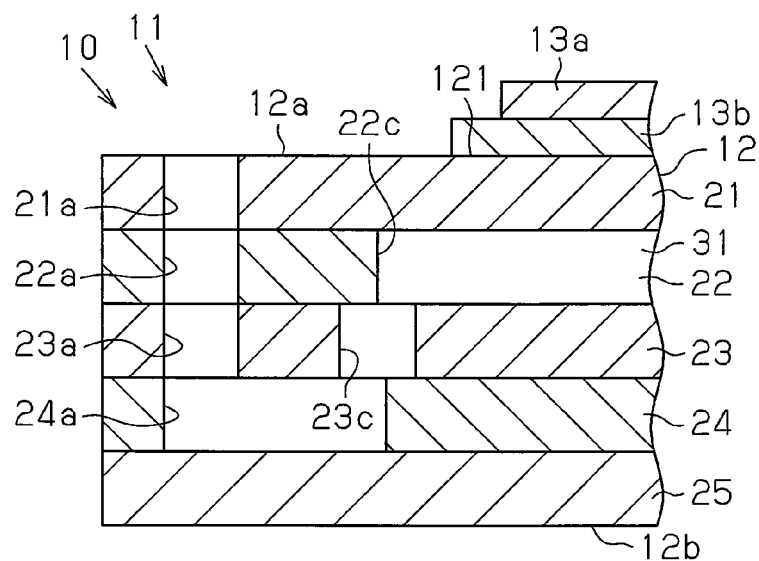
FIG. 9 is a partially enlarged cross-sectional view of another embodiment of a semiconductor device.

As shown in FIG. 9, for example, the open area of the first communication hole 23c may be set to be smaller than that of the first embodiment. This increases the flow speed of the coolant when passing through the first communication hole 23c. In this case, jet flow may be generated in the coolant flowing from the first communication 23c to each first slit 22c. As a result, the performance for cooling the semiconductor element 13a may be further improved. In the same manner, the open area of the third communication hole 23e may be set to be smaller than that of the first embodiment. This increases the flow speed of the coolant when passing through the third communication hole 23e.

Figure 10:
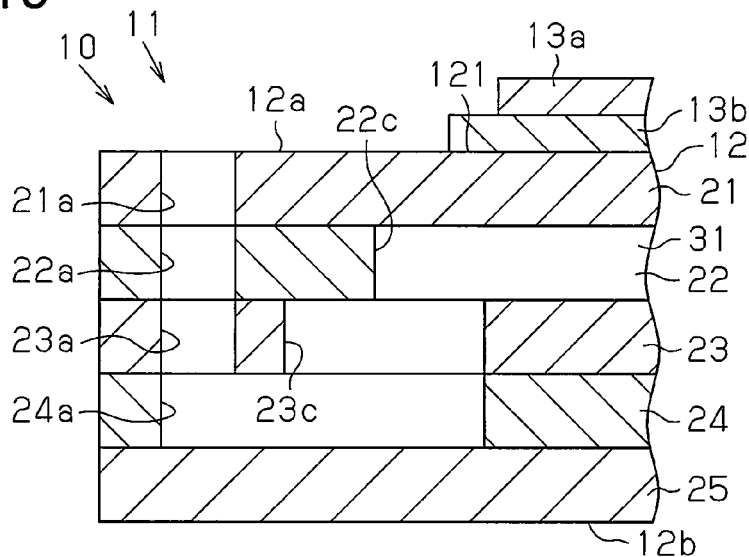
FIG. 10 is a partially enlarged cross-sectional view of another embodiment of a semiconductor device.

As shown in FIG. 10, for example, the open area of the first through hole 24a may be set to be larger than that of the first embodiment. Also, in the same manner, the open area of the second through hole 24b may be set to be larger than that of the first embodiment.

Figure 11:
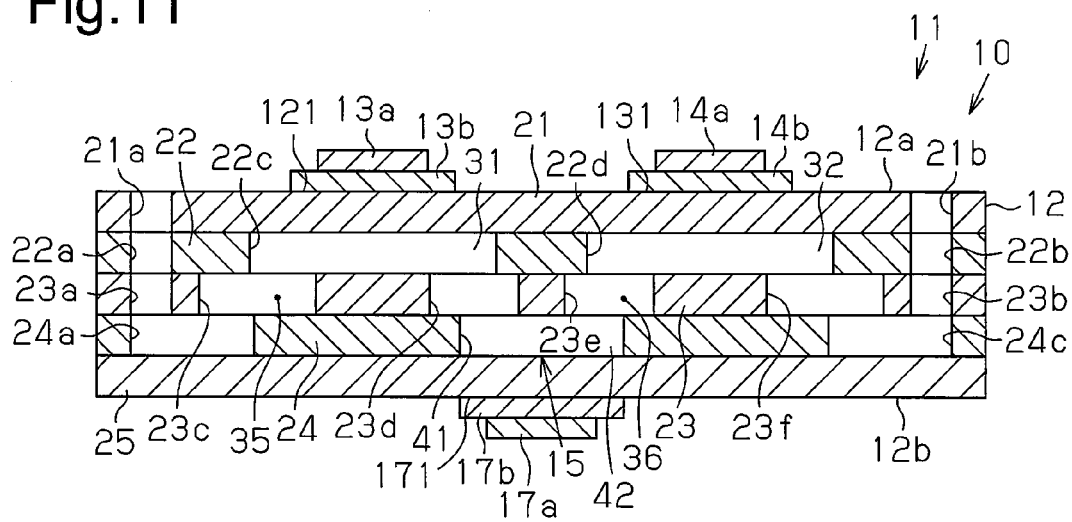
FIG. 11 is a cross-sectional view of another embodiment of a semiconductor device.

As shown in FIG. 11, a third mounting portion 171, which serves as a mounting portion, may be additionally located on a position of the second surface 12b that is located beyond a portion of the coolant passage 15 that is located between the first mounting portion 121 and the second mounting portion 131 and extends in a direction from the first mounting portion 121 toward the second surface 12b of the base body 12. In this case, the second through hole 24b is replaced with a plurality of slits 41, and a plurality of fins 42 are arranged in the fourth ceramic sheet 24. The fins 42 are at least partially overlapped with the third mounting portion 171 as viewed from the stacking direction A. A metal plate 17b to which a semiconductor element 17a is coupled is mounted on the third mounting portion 171. The semiconductor element 17a is cooled by dissipating heat to the coolant flowing through the slits 41. The semiconelement 17a corresponds to a third cooling subject. In this case, the maximum number of semiconductor elements may be mounted on the heat dissipation device 11, the total volume may be reduced, and the performance for cooling the semiconductor elements 13a, 14a, and 17a, which are mounted on the heat dissipation device 11, may be improved.

Figure 12:
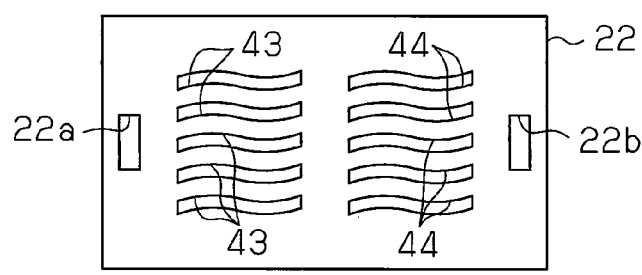
FIG. 12 is a plan view of another embodiment of a ceramic sheet.

As shown in FIG. 12, the second ceramic sheet 22 may include a plurality of first slits 43 and second slits 44, each of which are undulated. This increases the heat dissipation surface area as compared to the first slits 22c and the second slits 22d, which are straight in a plan view. Also, the agitation effect is obtained. This further improves the performance for cooling the semiconductor elements 13a and 14a.

In the first embodiment, the positions of the coolant supply hole and the coolant discharge hole of the coolant passage 15 may be changed. For example, the coolant supply hole and the coolant discharge hole may open in the second surface 12b of the base body 12.

In the first embodiment, the first slits 22c and the second slits 22d only need to be at least partially overlapped with a region that includes the first mounting portion 121 and the second mounting portion 131 as viewed from the stacking direction A.

In the first embodiment, the number of the first slits 22c and the second slits 22d may be changed. The number of slits is changed in accordance with the area of a semiconductor element, the passage width of the coolant passage 15, and the like. For example, when the region area forming the coolant passage 15 is the same, the number of slits decreases if the passage width increases, and the number of slits increases if the passage width decreases.

In the first embodiment, the number of ceramic sheets that are stacked to form the base body 12 of the heat dissipation device 11 may be changed. For example, the number of ceramic sheets stacked is increased or decreased in accordance with the cross-sectional area (passage area) of the coolant passage 15 formed in the heat dissipation device 11.

The first embodiment does not particularly limit the number of semiconductor elements or metal plates.

The first embodiment does not particularly limit the number of mounting portions.

In the first embodiment, the heat dissipation device 11 may be cooled by undergoing air cooling. In this structure, a cooling gas, such as air, flows to the coolant passage 15.

The heat dissipation device 11 of the first embodiment shown in FIG. 4 may include an extension passage, which has the same structure as the extension passage W, at the side of the second slit 22d in addition to the extension passage W connected to the first slit 22c.

Figure 13:
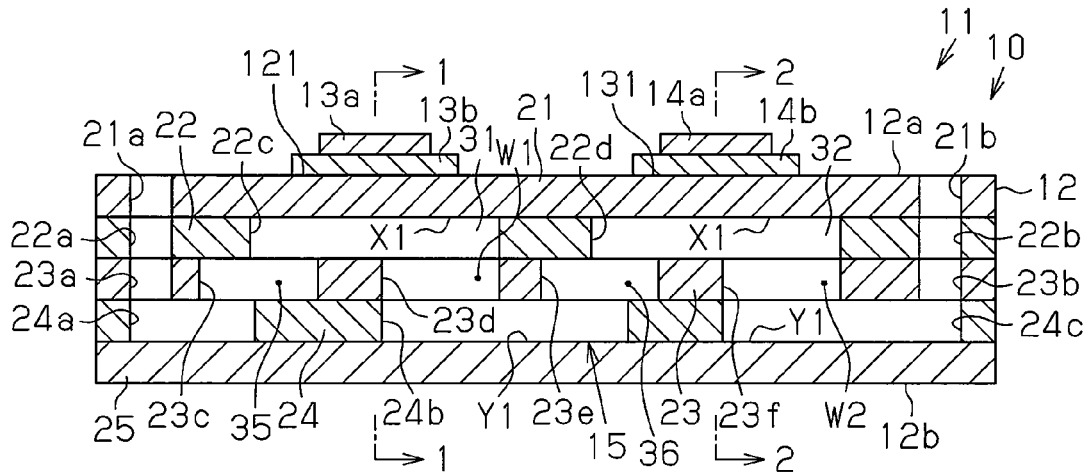
FIG. 13 is a cross-sectional view of another embodiment of a semiconductor device.
Figure 14:
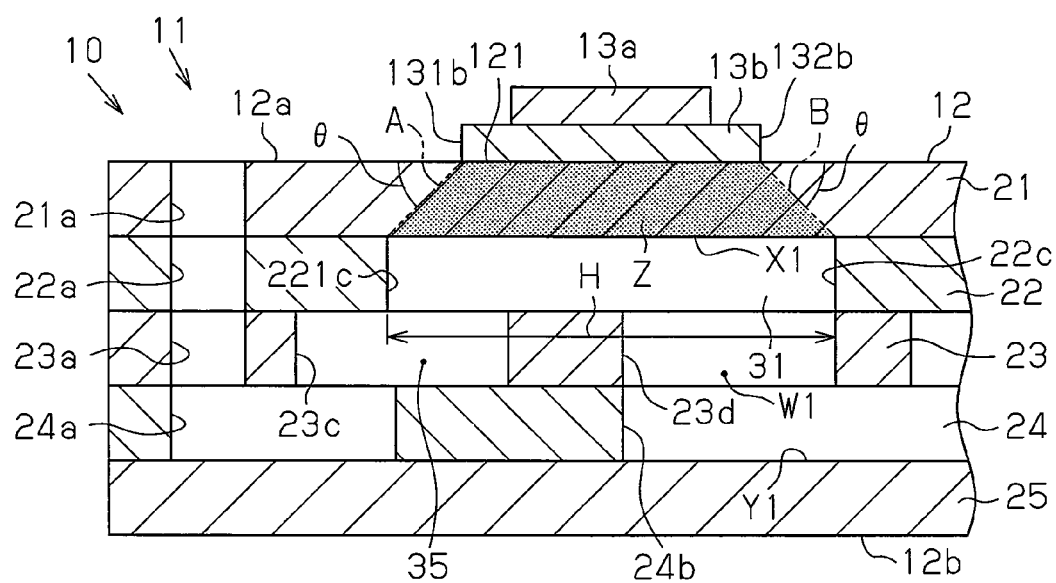
FIG. 14 is a partially enlarged cross-sectional view of the semiconductor device of FIG. 13.

As shown in FIGS. 13 and 14, extension passages W1 and W2 extending straight in the stacking direction of the first to fifth ceramic sheets 21 to 25 may be arranged as the extension passage W. The extension passage W1 is a portion of the coolant passage 15 that is formed by the first slit 22c, the second communication hole 23d, and the second through hole 24b. The extension passage W2 is a portion of the coolant passage 15 that is formed by the second slit 22d, the fourth communication hole 23f, and the third through hole 24c. As shown in FIG. 14, in the extension passage W1, the passage surface X1, which is formed by a surface of the first ceramic sheet 21, is opposed in the stacking direction to the passage surface Y1, which is formed by a surface of the fifth ceramic sheet 25. The same applies to the extension passage W2. The straight extension passages W1 and W2 further decrease the pressure loss of the coolant compared to when the passage is formed in a stepped manner. Also, the reduction of steps further limits expansion of the coolant passage 15 in the lateral direction. This further decreases the size of the heat dissipation device 11.

Figure 15:
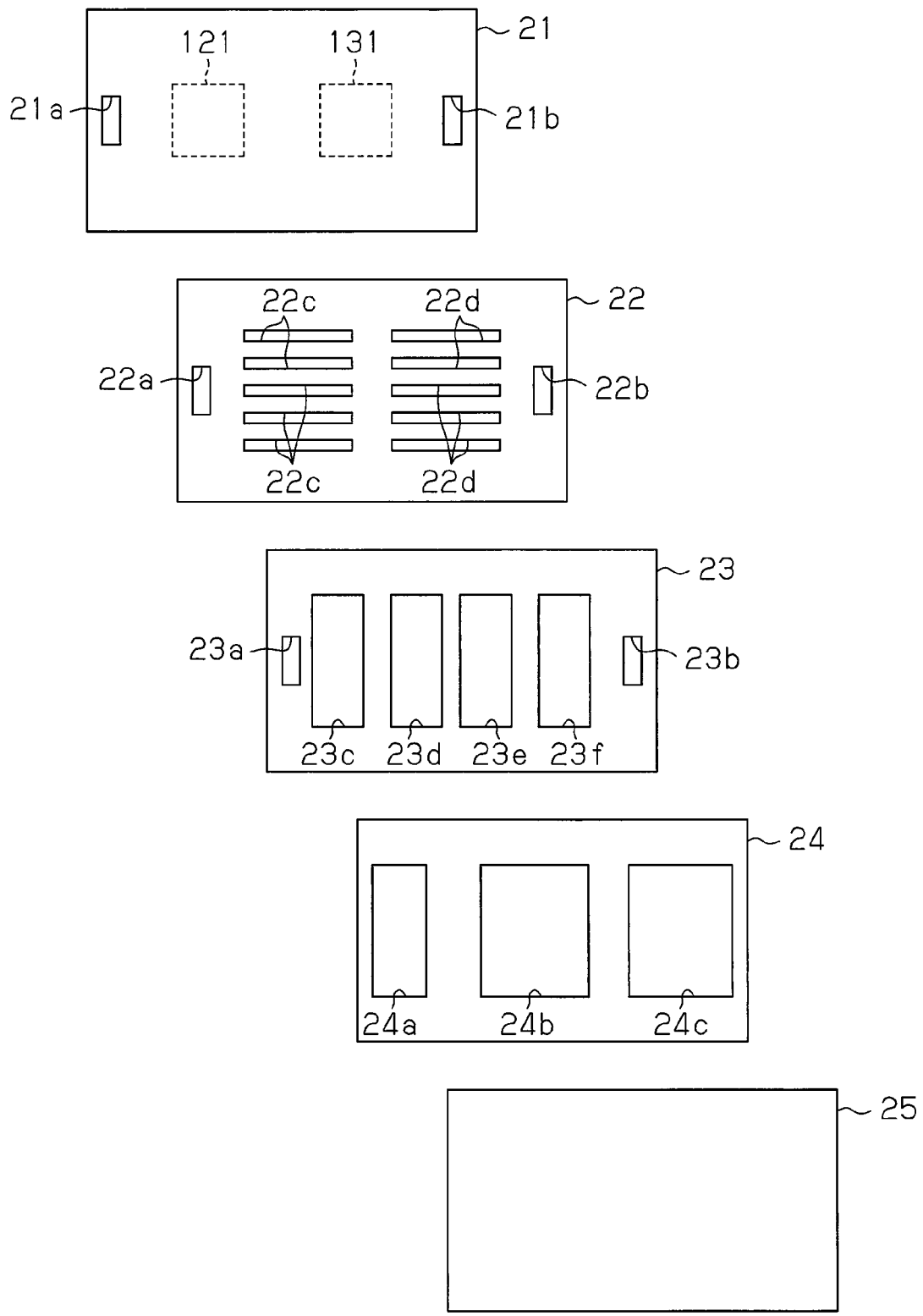
FIG. 15 is a plan view of a plurality of ceramic sheets, which are elements of a heat dissipation device of the semiconductor device of FIG. 13.

As shown in FIG. 15, when forming the straight extension passage W1, the position of the second communication hole 23d at an end (end that is located closer to the second coolant outlet hole 23b) opposite to the end that is located closer to the second coolant inlet hole 23a is aligned with the position of the first slit 22c at an end (end that is located closer to the first coolant outlet hole 22b) opposite to the end that is located closer to the first coolant inlet hole 22a. Also, when forming the extension passage W1, the position of the second communication hole 23d at the end that is located closer to the second coolant inlet hole 23a is aligned with the position of the second through hole 24b at an end that is located closer to the first through hole 24a. When forming the straight extension passage W2, the position of the fourth communication hole 23f at an end that is located closer to the second coolant outlet hole 23b is aligned with the position of the second slit 22d at an end that is located closer to the first coolant outlet hole 22b. Also, when forming the extension passage W2, the position of the fourth communication hole 23f at an end (end that is located closer to the second coolant inlet hole 23a) opposite to the end that is located closer to the second coolant outlet hole 23b is aligned with the position of the third through hole 24c at an end that is located closer to the second through hole 24b.

Second Embodiment

A second embodiment of the present invention will now be described with reference to FIGS. 16 to 20.

Figure 16:
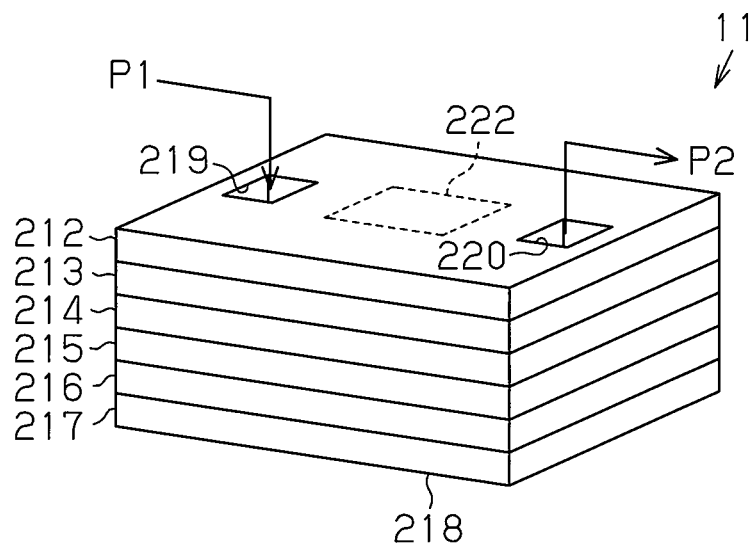
FIG. 16 is a perspective view of a second embodiment of a heat dissipation device.

As shown in FIG. 16, a heat dissipation device 11 includes a base body 218, which is formed by stacking a plurality of sheets (six sheets in the second embodiment) of first to sixth ceramic members 212, 213, 214, 215, 216, and 217. Aluminum oxide, silicon nitride, silicon carbide, aluminum nitride, alumina zirconium, or the like, is used as the material of the ceramic member. Preferably, a ceramic material has high water resistance when water cooling is employed to cool the heat dissipation device 11.

The base body 218 includes a coolant supply hole 219 and a coolant discharge hole 220. A coolant is supplied from the exterior to a coolant passage formed in the base body 218 through the coolant supply hole 219. The coolant flowing through the coolant passage is discharged from the coolant passage to the outside of the base body 218 through the coolant discharge hole 220. The coolant supply hole 219 and the coolant discharge hole 220 each open in the first ceramic member 212, which is an element of the base body 218. That is, the coolant supply hole 219 and the coolant discharge hole 220 each open in one surface (first surface) of the base body 218. The coolant supply hole 219 is connectable to the supply pipe P1, which is connected to an external coolant supply source. The coolant discharge hole 220 is connectable to the discharge pipe P2, which discharges the coolant to the exterior. The base body 218 also includes a mounting portion 222 (indicated by broken lines in FIG. 16) of an electronic component 221 at a position where the mounting portion 222 is at least partially overlapped with the coolant passage as viewed from a stacking direction of the first to sixth ceramic members 212, 213, 214, 215, 216, and 217 (hereafter, may be simply referred to as a stacking direction B). In the second embodiment, the mounting portion 222 is arranged on a surface (first face) of the first ceramic member 212 located at the exterior of the base body 218 in which the coolant supply hole 219 and the coolant discharge hole 220 open.

Figure 17:
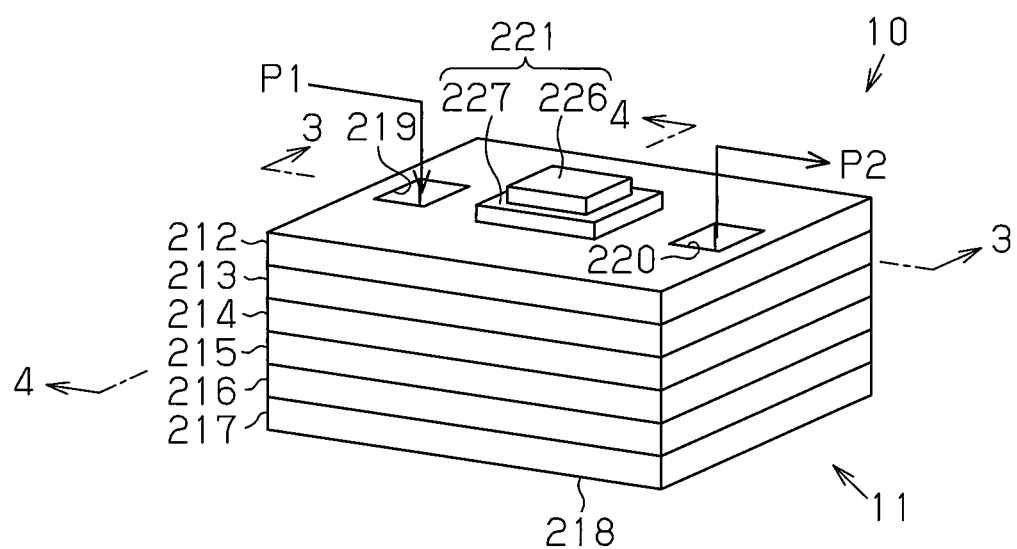
FIG. 17 is a perspective view of a semiconductor device that includes the heat dissipation device of FIG. 16.

As shown in FIG. 17, in the same manner as the first embodiment, a semiconductor device 10 is formed by mounting a metal plate 227 on the mounting portion 222 located on the base body 218 of the heat dissipation device 11. A semiconductor element 226, which serves as the electronic component 221, is coupled to the metal plate 227. The metal plate 227, which functions as a wiring layer and a bonding layer, is pure aluminum (e.g., 1000 series aluminum, which is pure aluminum for industrial use) or copper. The semiconductor element 226 is, for example, an insulated gate bipolar transistor (IGBT) or a diode. The semiconductor element 226 and the metal plate 227, and the metal plate 227 and the heat dissipation device 11, are each joined by performing metallic joining, for example, soldering or brazing.

The heat dissipation device 11 of the second embodiment will now be described in detail.

Figure 18:
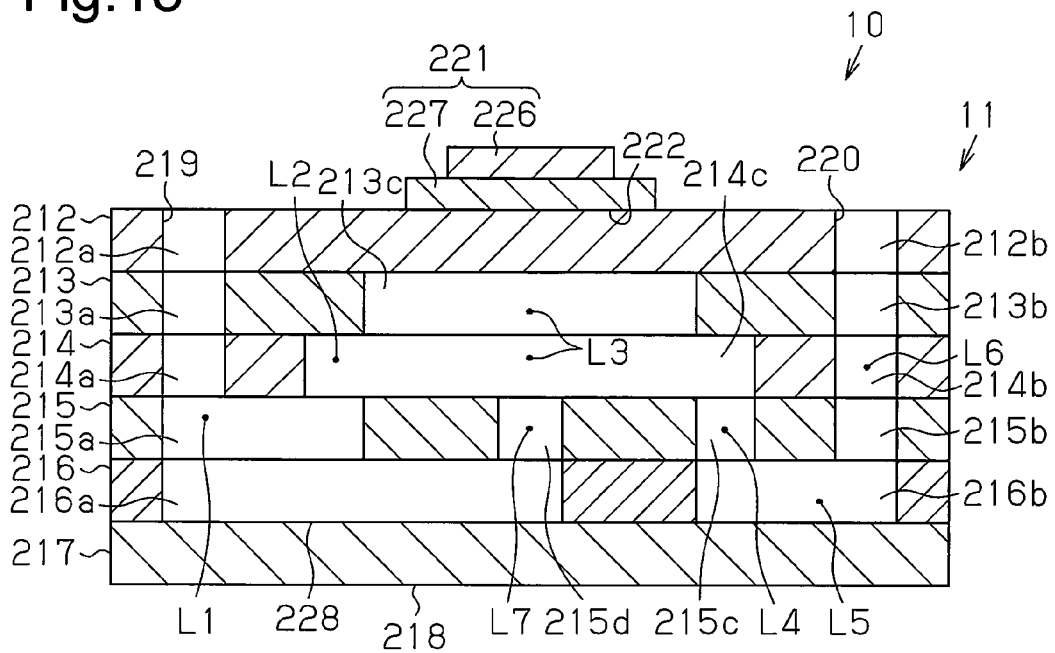
FIG. 18 is a cross-sectional view of FIG. 17 taken along line 3-3.
Figure 19:
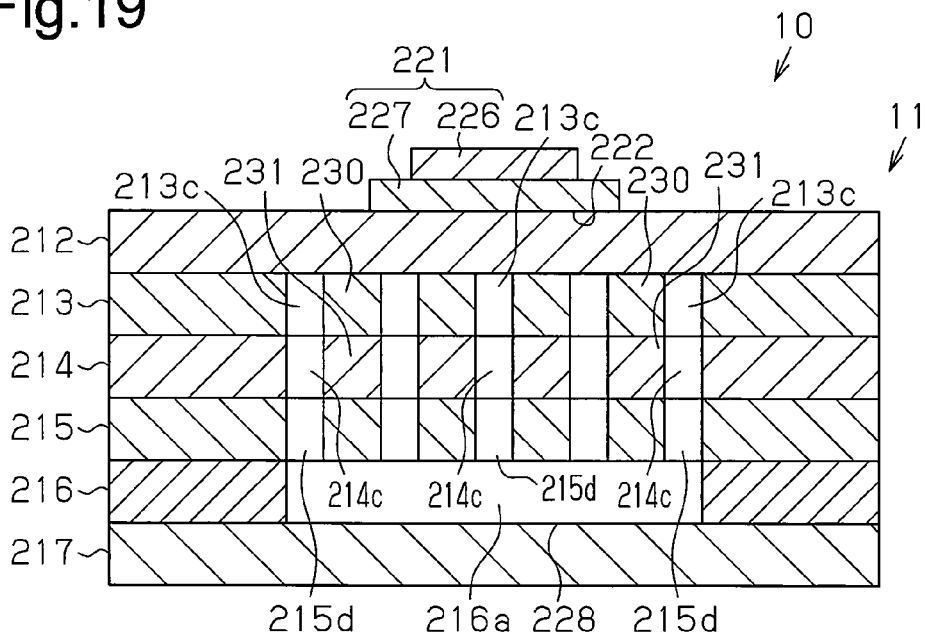
FIG. 19 is a cross-sectional view of FIG. 17 taken along line 4-4.

As shown in FIGS. 18 and 19, a coolant passage 228 that communicates the coolant supply hole 219 and the coolant discharge hole 220 is formed in the base body 218 of the heat dissipation device 11. In the description hereafter, the first ceramic member 212, which is the element of the base body 218 and includes the mounting portion 222, is located at the upper side, and the sixth ceramic sheet 217, which is located at the farthest position from the first ceramic member 212, is located at the lower side.

The coolant passage 228 includes first to seventh passages L1 to L7. More specifically, the first passage L1 is straight and continuous to the coolant supply hole 291. The coolant flows through the first passage L1 in a vertically lower direction. The second passage L2 branches from the first passage L1. The coolant flows through the second passage L2 obliquely upward. The third passage L3 is straight, continuous to the second passage L2, and formed underneath the mounting portion 222. The coolant flows through the third passage L3 in the horizontal direction. The fourth passage L4 is straight and continuous to the third passage L3. The coolant flows through the fourth passage L4 in the vertically lower direction. The fifth passage L5 is straight and continuous to the fourth passage L4. The coolant flows through the fifth passage L5 in the horizontal direction. The sixth passage L6 is straight and continuous to the fifth passage L5. The coolant flows through the sixth passage L6 in a vertically direction. The seventh passage L7 is straight and branches from the first passage L1 together with the second passage L2. The coolant flows through the seventh passage L7 from the vertically lower side to the vertically upper side toward the third passage L3 located underneath the mounting portion 222. The first to sixth ceramic members 212 to 217 includes a plurality of passage holes, which are elements of the coolant passage 228. The passage holes are joined in the stacking direction of the first to sixth ceramic members 212 to 217 to form the first to seventh passages L1 to L7.

Figure 20:
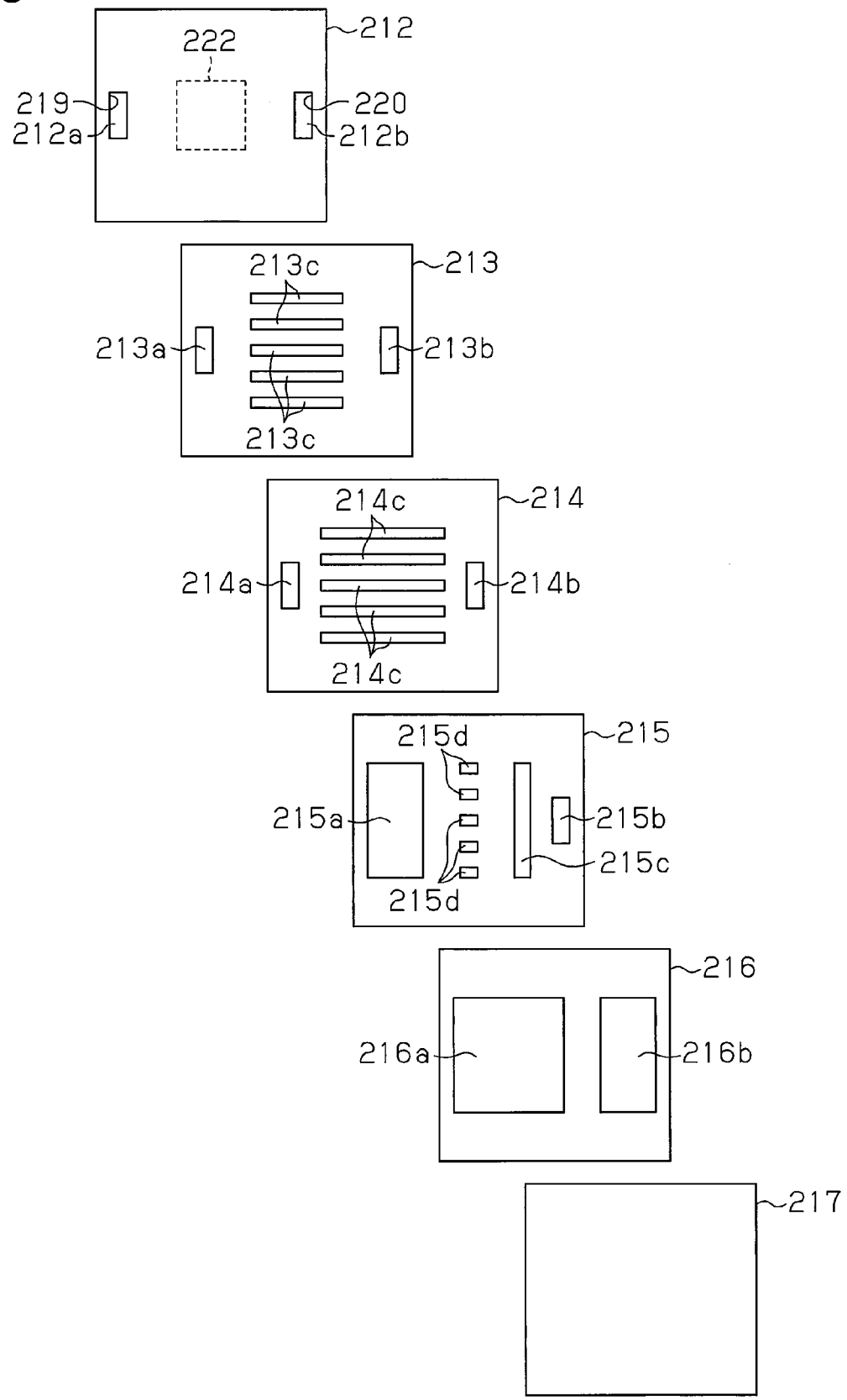
FIG. 20 is a plan view of a plurality of ceramic sheets, which are elements of a base body of the heat dissipation device of FIG. 16.

Each member of the heat dissipation device 11 will now be described with reference to FIG. 20. In FIG. 20, a sheet forming the ceramic member is referred to as a ceramic sheet. The same reference numeral as the ceramic member is given to the ceramic sheet.

As shown in FIG. 20, in the second embodiment, the first to sixth ceramic sheets 212 to 217, which are elements of the heat dissipation device 11, are rectangle and have the same length and the same width.

The first ceramic sheet 212 forms a top plate of the heat dissipation device 11 where the mounting portion 222 is located. A first passage hole 212a including the coolant supply hole 219 and a sixth passage hole 212b including the coolant discharge hole 220 are located at opposite ends of the mounting portion 222. The first passage hole 212a and the sixth passage hole 212b have the same open area.

The second ceramic sheet 213 is located below the first ceramic sheet 212 when stacked. The second ceramic sheet 213 includes a first passage hole 213a and a sixth passage hole 213b. The first passage hole 213a is located at a position corresponding to the first passage hole 212a of the first ceramic sheet 212 and communicates with the first passage hole 212a. The first passage hole 213a has the same open area as the first passage hole 212a. The sixth passage hole 213b is located at a position corresponding to the sixth passage hole 212b of the first ceramic sheet 212 and communicates with the sixth passage hole 212b. The sixth passage hole 213b has the same open area as the sixth passage hole 212b. Also, the second ceramic sheet 213 includes a plurality of slit-like third passage holes 213c (five slits in the second embodiment) between the first passage hole 213a and the sixth passage hole 213b. Each third passage hole 213c has the same shape and extends straight. The length of the third passage hole 213c in the extending direction (longitudinal direction) is greater than the length of the mounting portion 222 in the same direction. The third passage holes 213c are arranged along a direction orthogonal to the extending direction (longitudinal direction) at regular intervals. As shown in FIGS. 18 and 19, a portion of the third passage hole 213c is located underneath the mounting portion 222. The other portion of the third passage hole 213c is located outside the mounting portion 222 as viewed from the stacking direction B.

The third ceramic sheet 214 is located below the second ceramic sheet 213 when stacked. The third ceramic sheet 214 includes a first passage hole 214a and a sixth passage hole 214b. The first passage hole 214a is located at a position corresponding to the first passage hole 213a of the second ceramic sheet 213 and communicates with the first passage hole 213a. The first passage hole 214a has the same open area as the first passage hole 213a. The sixth passage hole 214b communicates with the sixth passage hole 213b of the second ceramic sheet 213 and has the same open area as the sixth passage hole 213b. The third ceramic sheet 214 also includes a plurality of slit-like third passage holes 214c (five slits in the second embodiment) between the first passage hole 214a and the sixth passage hole 214b. Each third passage hole 214c has the same shape and extends straight. Each third passage hole 214c is located in a position where the third passage hole 214c is partially overlapped with the third passage hole 213c of the second ceramic sheet 213 as viewed from the stacking direction B. The length of each third passage hole 214c in the extending direction (longitudinal direction) is greater than the length of the third passage hole 213c of the second ceramic sheet 213 in the same direction. The third passage holes 214c are arranged along a direction orthogonal to the extending direction (longitudinal direction) at regular intervals. When the second ceramic sheet 213 and the third ceramic sheet 214 are stacked, opposite ends of the third passage hole 214c are located at positions that are projected by the same length outward from opposite ends of the third passage hole 213c as viewed from the stacking direction B.

As shown in FIG. 19, when the second ceramic sheet 213 and the third ceramic sheet 214 are stacked, each third passage hole 213c are overlapped with each third passage hole 214c in the stacking direction. This forms the third passage L3, which has the height of two ceramic sheets.

The fourth ceramic sheet 215 is located below the third ceramic sheet 214 when stacked. The fourth ceramic sheet 215 includes a first passage hole 215a. When the third ceramic sheet 214 is stacked, the first passage hole 215a is located at a position where the first passage hole 215a is entirely overlapped with the first passage hole 214a and partially overlapped with the third passage hole 214c that is located closer to the first passage hole 214a as viewed from the stacking direction B. The open area of the first passage hole 215a is greater than the open area of the first passage hole 214a of the third ceramic sheet 214. The length of the first passage hole 215a in a direction orthogonal to the extending direction of the third passage hole 214c of the third ceramic sheet 214 is the same as the length between inner surfaces of the third passage holes 214c that are located at the opposite outermost positions.

The fourth ceramic sheet 215 includes a sixth passage hole 215b. The sixth passage hole 215b is located at a position corresponding to the sixth passage hole 214b of the third ceramic sheet 214 and communicates with the sixth passage hole 214b. The sixth passage hole 215b has the same open area as the sixth passage hole 214b. The fourth ceramic sheet 215 also includes a fourth passage hole 215c between the first passage hole 215a and the sixth passage hole 215b. The fourth passage hole 215c is located in a position where the fourth passage hole 215c is partially overlapped with each third passage hole 214c that is located closer to the sixth passage hole 214b as viewed from the stacking direction B.

The fourth ceramic sheet 215 also includes a plurality of slit-like seventh passage holes 215d (five slits in the second embodiment) between the first passage hole 215a and the fourth passage hole 215c. Each seventh passage hole 215d has the same shape and extends straight. Each seventh passage hole 215d is located in a position where the seventh passage hole 215d is overlapped with the third passage hole 214c of the third ceramic sheet 214 as viewed from the stacking direction B. The length of each seventh passage hole 215d in the extending direction (longitudinal direction) is less than the length of each of the third passage holes 213c and 214c of the second and third ceramic sheets 213 and 214 in the same direction. The seventh passage holes 215d are arranged along a direction orthogonal to the extending direction (longitudinal direction) at regular intervals. The centers of the seventh passage holes 215d are arranged along a line that extends through the center of the mounting portion 222 in a direction orthogonal to the extending direction of the third passage holes 213c and 214c.

The fifth ceramic sheet 216 is located below the fourth ceramic sheet 215 when stacked. The fifth ceramic sheet 216 includes a first passage hole 216a and a fifth passage hole 216b. When the fourth ceramic sheet 215 is stacked, the first passage hole 216a is located at a position where the first passage hole 216a is entirely overlapped with the first passage hole 215a and each seventh passage hole 215d as viewed from the stacking direction B. Also, when the fourth ceramic sheet 215 is stacked, the fifth passage hole 216b is located at a position where the fifth passage hole 216b is entirely overlapped with the sixth passage hole 215b and the fourth passage hole 215c as viewed from the stacking direction B. The sixth ceramic sheet 217 is located below the fifth ceramic sheet 216 when stacked. The sixth ceramic sheet 217 forms a bottom plate of the heat dissipation device 11.

The base body 218 of the heat dissipation device 11 is formed by sequentially stacking the fifth ceramic member 216, the fourth ceramic member 215, the third ceramic member 214, the second ceramic member 213, and the first ceramic member 212 on the sixth ceramic member 217. As described above, the coolant passage 228 is formed in the base body 218 having such a structure.

The first passage L1 is formed by connecting each first passage hole 212a, 213a, 214a, 215a, 216a of the first to fifth ceramic members 212 to 216. The second passage L2 is formed by connecting a portion of the first passage hole 215a of the fourth ceramic member 215, a portion of the third passage hole 214c of the third ceramic member 214, and a portion of the third passage hole 213c of the second ceramic member 213 in a stepped manner. The third passage L3 is formed by connecting the third passage hole 213c of the second ceramic member 213 and the third passage hole 214c of the third ceramic member 214.

The fourth passage L4 is formed by connecting a portion of the third passage hole 214c of the third ceramic member 214, the fourth passage hole 215c of the fourth ceramic member 215, and a portion of the fifth passage hole 216b of the fifth ceramic member 216 in a straight line. The fifth passage L5 is formed by the fifth passage hole 216b of the fifth ceramic member 216, which is connected to the fourth passage hole 215c of the fourth ceramic member 215. The sixth passage L6 is connected to the fifth passage hole 216b of the fifth ceramic member 216 and formed by connecting each sixth passage hole 212b, 213b, 214b, 215b of the first to fourth ceramic members 212 to 215. The seventh passage L7 is formed by the seventh passage holes 215d of the fourth ceramic member 215, which are connected to the first passage hole 216a of the fifth ceramic member 216.

The third passage L3 of the second embodiment serves as an underneath-lying passage through which coolant flows underneath the mounting portion 222. The second passage L2 of the second embodiment is in communication with the third passage L3 at the upstream side in a flow direction of the coolant and forms a supply passage that supplies the coolant to the third passage L3 together with the first passage L1 connected to the second passage L2. The fourth passage L4 of the second embodiment is in communication with the third passage L3 at the downstream side in the flow direction of the coolant and forms a discharge passage that discharges the coolant from the third passage L3 together with the fifth passage L5 connected to the fourth passage L4 and the sixth passage L6 connected to the fifth passage L5. The seventh passage L7 of the second embodiment is located between the supply passage and the discharge passage and serves as an expulsion passage that expels the coolant to the third passage L3 from the vertically lower side toward the vertically upper side. The seventh passage L7 serving as the expulsion passage expels the coolant toward a central section of the mounting portion 222.

As shown in FIG. 19, the base body 218 includes fins 230 and 231. The fin 230 is located between the third passage holes 213c of the second ceramic member 213 forming the third passage L3. The fin 231 is located between the third passage holes 214c of the third ceramic member 214 forming the third passage L3. The fins 230 and 231 are overlapped in the stacking direction B. The fins 230 and 231 are straight fins.

The operation of the second embodiment will now be described.

In the heat dissipation device 11 of the second embodiment, the coolant supplied through the coolant supply hole 219 to the coolant passage 228 first flows through the first passage L1 toward a lower side of the heat dissipation device 11. The coolant in the first passage L1 is separated to flow into the second passage L2 and the seventh passage L7, which branch from the first passage L1. Then, the coolant flows from the second passage L2 and the seventh passage L7 to the third passage L3. The heat of the electronic component 221 (semiconductor element 226 and metal plate 227) is dissipated to the coolant flowing through the first passage L3 by way of the surface of the first ceramic member 212, which covers the third passage L3, and the fins 230 and 231. After heat is exchanged, the coolant flows from the third passage L3 through the fourth passage L4, the fifth passage L5, and the sixth passage L6, and out of the coolant discharge hole 220.

The heat dissipation device 11 of the second embodiment includes the second passage L2, through which the coolant flows toward the third passage L3 in an oblique direction from a peripheral region of the mounting portion 222 of the electronic component 221 toward the mounting portion 222, and the seventh passage L7, through which the coolant flows toward the central section of the mounting portion 222 from the lower side to the upper side. The coolant flowing through the second passage L2 and the seventh passage L7 are expelled toward the third passage L3 from the lower side to the upper side. This generates a jet flow in the coolant flowing through the third passage L3 and agitates the coolant. The agitation thins a temperature boundary layer of the coolant flowing through the third passage L3. Particularly, the coolant is expelled from the seventh passage L7 toward the central portion of the electronic component 221, which has the highest temperature in the mounting portion 222. This allows the coolant to directly strike a heating surface and effectively thins the temperature boundary layer.

Accordingly, the second embodiment has the advantages described below.

(8) The seventh passage L7 is arranged to expel the coolant into the third passage L3 from the vertically lower side to the vertically upper side. This allows the coolant to directly strike a location corresponding to the mounting portion 222. This effectively agitates the coolant flowing through the third passage L3 and thins the temperature boundary layer of the coolant flowing through the third passage L3. Thus, the performance for cooling the cooling subject can be improved.

(9) The seventh passage L7 branches from the first passage L1. This simplifies the structure of the coolant passage 228 formed in the base body 218.

(10) The seventh passage L7 expels the coolant toward the central section of the mounting portion 222. This effectively thins the temperature boundary layer of the coolant flowing through the third passage L3. Thus, the performance for cooling the cooling subject can be further improved.

(11) The coolant supply hole 219 and the coolant discharge hole 220 open in the surface (first surface) of the base body 218 where the mounting portion 222 is arranged. This allows for a collective arrangement of components needed for the heat dissipation device 11, such as, the supply pipe P1 connected to the coolant supply hole 219, and the discharge pipe P2 connected to the coolant discharge hole 220. As a result, the heat dissipation device 11 can be reduced in size.

(12) The coolant is expelled from the second passage L2 and the seventh passage L7 toward the third passage L3. This effectively agitates the coolant flowing through the third passage L3 and thins the temperature boundary layer of the coolant flowing through the third passage L3.

(13) The straight fourth passage L4 decreases pressure loss of the coolant as compared to when the fourth passage L4 includes steps. Also, the straight fourth passage L4 reduces steps in the coolant passage 228 and limits expansion of the coolant passage 228 in the lateral direction. This reduces the size of the heat dissipation device 11.

(14) The semiconductor device 10 having the heat dissipation device 11 can effectively cool the electronic component 221 (semiconductor element 226 and metal plate 227). This improves the performance for cooling the electronic component 221.

(15) The ceramic heat dissipation device 11 may have a cooling function and an insulative property. This allows for the formation of the semiconductor device 10 by directly joining the heat dissipation device 11 with the electronic component 221 (semiconductor element 226 and metal plate 227). Thus, the semiconductor device 10 may be reduced in size and the number of components.

The second embodiment may be modified as follows.

Figure 21:
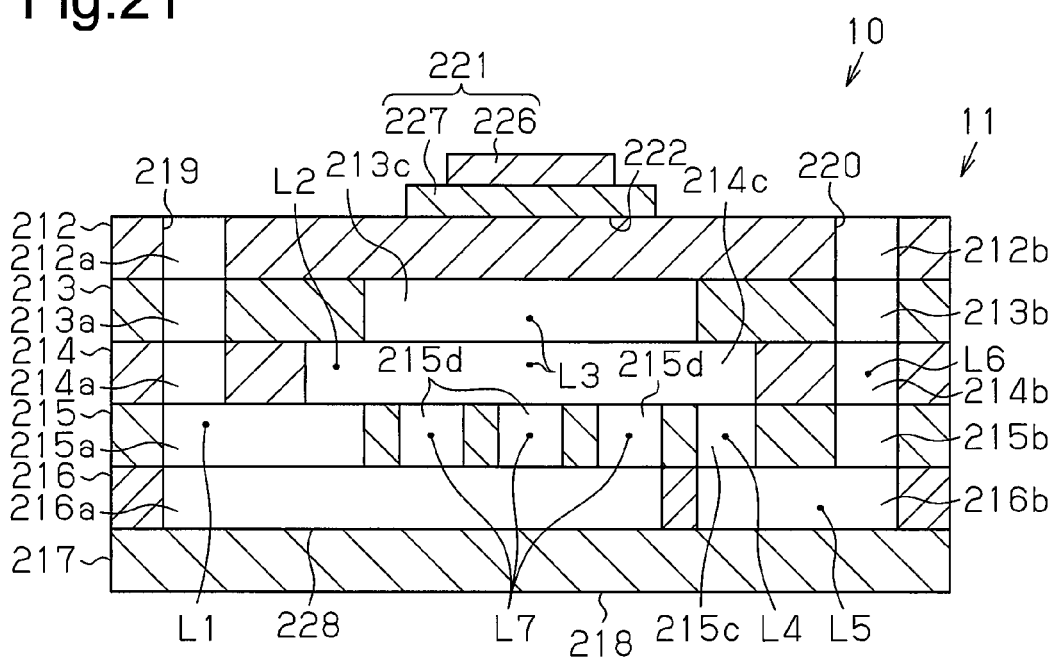
FIG. 21 is a cross-sectional view of another embodiment of a semiconductor device.

As shown in FIG. 21, in the second embodiment, a plurality of the seventh passages L7 may be arranged in the coolant passage 228. When a plurality of the seventh passages L7 are used, coolant expelling positions of the seventh passages L7 are located within the region of the mounting portion 222 as viewed from the stacking direction B. This further increases the effect of the jet flow. Preferably, at least one of the seventh passages L7 is located in a position where the coolant is expelled toward the central section of the mounting portion 222. In this structure, the seventh passages L7 allow the coolants to directly strike a location corresponding to the mounting portion 222 from a wide range. This effectively thins the temperature boundary layer of the coolant flowing through the third passage L3 and further improves the performance for cooling the cooling subject.

In the second embodiment, the base body 218 may include undulated fins by forming undulated third passage holes 213c and 214c. The undulated fins increase the area that contacts the coolant and has a coolant agitating effect. This improves the cooling performance.

In the second embodiment, a passage that supplies the coolant to the second passage L2 may differ from a passage that supplies the coolant to the seventh passage L7. For example, the coolant may be directly supplied to the seventh passage L7 from the exterior.

In the second embodiment, the coolant supply hole 219 and the coolant discharge hole 220 may be located at different positions in the base body 218. For example, the coolant supply hole 219 and the coolant discharge hole 220 may be located in the sixth ceramic member 217. One of the coolant supply hole 219 and the coolant discharge hole 220 may be located in the first ceramic member 212 when the other is located in the sixth ceramic member 217.

In the second embodiment, the fourth passage L4 may extend obliquely downward by connecting a portion of the third passage hole 214c of the third ceramic member 214, the fourth passage hole 215c of the fourth ceramic member 215, and a portion of the fifth passage hole 216b of the fifth ceramic member 216 in a stepped manner.

In the second embodiment, the number of the third passage holes 213c and 214c may be changed. The number is changed in accordance with the area of a semiconductor element, the passage width of the coolant passage 228, and the like. For example, when the area of the region forming the coolant passage 228 is the same, the number of the third passage holes 213c and 214c decreases if the passage width increases, and the number increases if the passage width decreases.

In the second embodiment, the number of ceramic members that are stacked to form the base body 218 of the heat dissipation device 11 may be changed. For example, the number of ceramic members stacked is increased or decreased in accordance with the cross-sectional area (passage area) of the coolant passage 228 formed in the heat dissipation device 11.

In the second embodiment, the heat dissipation device 11 may be cooled by undergoing liquid cooling or air cooling.

In the second embodiment, the number of the electronic components 221 mounted on the heat dissipation device 11 may be changed. The coolant passage 228 in the base body 218 may be modified in accordance with the number or the layout of the mounting portions 222 on which the electronic components 221 are mounted.

DESCRIPTION OF REFERENCE SYMBOLS

10 semiconductor device
11 heat dissipation device
12, 218 base body
12*a* first surface
12*b* second surface
13*a*, 14*a*, 17*a*, 226 semiconductor element (cooling subject)
13*b*, 14*b*, 17*b*, 227 metal plate
15, 228 coolant passage
21 first ceramic sheet serving as ceramic sheet
21*a*, 219 coolant supply hole
21*b*, 220 coolant discharge hole
22 second ceramic sheet serving as ceramic sheet corresponding to slit formation layer
22*c*, 43 first slit serving as slit
22*d*, 44 second slit serving as slit
22*h* communication portion
23 third ceramic sheet serving as ceramic sheet corresponding to communication passage formation layer
23*c* first communication hole corresponding to communication passage
23*d* second communication hole corresponding to communication passage
23*e* third communication hole corresponding to communication passage
23*f* fourth communication hole corresponding to communication passage
24 fourth ceramic sheet serving as ceramic sheet
25 fifth ceramic sheet serving as ceramic sheet
35, 36 overlapping portion
41 slit
121 first mounting portion serving as mounting portion
131 second mounting portion serving as mounting portion
171 third mounting portion serving as mounting portion
212 to 217 first to sixth ceramic members (ceramic sheets)
222 mounting portion
212*a*, 213*a*, 214*a*, 215*a*, 216*a* first passage hole
212*b*, 213*b*, 214*b*, 215*b* sixth passage hole
213*c*, 214*c* third passage hole
215*c* fourth passage hole
215*d* seventh passage hole
216*b* fifth passage hole
W, W1, W2 extension passage
X1, Y1 passage surface
L1 to L7 first to seventh passages

The invention claimed is:

1. A heat dissipation device comprising:
a base body formed by stacking a plurality of ceramic sheets;
a coolant passage located in the base body, wherein coolant flows through the coolant passage;
at least one mounting portion defined in a first surface of the base body as a location where a cooling subject is mounted;
a slit formation layer formed by at least one of the ceramic sheets, wherein the slit formation layer includes a plurality of elongate slits that form a portion of the coolant passage, the slits are oriented such that a lengthwise direction thereof extends in a lengthwise direction of the base body, and the slits are formed to be at least partially overlapped with a region that includes the mounting portion as viewed from a stacking direction of the ceramic sheets; and
a communication passage formation layer formed by at least one of the ceramic sheets, wherein the communication passage formation layer forms a portion of the coolant passage and includes a communication passage that communicates the slits, and the slits are located toward the mounting portion from the communication passage in the stacking direction of the ceramic sheets,
wherein an overlapping portion of the slits and the communication passage is located proximate to a region where the mounting portion is located as viewed from the stacking direction, and
wherein, in a cross-sectional view, the overlapping portion, which is located at a upstream side of the coolant passage in correspondence with the mounting portion, includes a first overlapping portion that is located directly beneath the mounting portion and a second overlapping portion that excludes the first overlapping portion, and the length of the second overlapping portion is greater than the length of the first overlapping portion.

2. The heat dissipation device according to claim 1, wherein
a plurality of the mounting portions are arranged side by side on the first surface of the base body,
a portion of the coolant passage that is located between adjacent ones of the mounting portions as viewed from the stacking direction extends from one of the adjacent ones of the mounting portions toward a second surface of the base body that is located at the opposite side of the first surface and further extends from the second surface toward the other of the adjacent ones of the mounting portions.

3. The heat dissipation device according to claim 2, wherein
the base body further includes a mounting portion on which a different cooling subject is mounted, wherein the mounting portion is located in the second surface where a portion of the coolant passage from one of the adjacent ones of the mounting portions toward the second surface extends to.

4. The heat dissipation device according to claim 1, wherein
an extension passage extends from a downstream side of the slits of the slit formation layer in a direction the coolant flows toward the second surface of the base body, which is located at the opposite side of the first surface, and
a portion of a passage surface of the extension passage that is located closer to the first surface is opposed to a portion of a passage surface of the extension passage that is located closer to the second surface in the stacking direction.

5. The heat dissipation device according to claim 2, wherein the slit formation layer includes a plurality of first slits, a plurality of second slits, and a communication portion that communicates a plurality of the first slits and a plurality of the second slits, the first slits are at least partially overlapped with a region that includes one of the adjacent ones of the mounting portions as viewed from the stacking direction, and the second slits are at least partially overlapped with a region that includes the other of the adjacent ones of the mounting portions as viewed from the stacking direction.

6. The heat dissipation device according to claim 1, wherein the coolant passage includes an underneath-lying passage formed underneath the mounting portion, a supply passage in communication with an upstream side of the underneath-lying passage in a direction the coolant flows, wherein the supply passage supplies the coolant to the underneath-lying passage, a discharge passage in communication with a downstream side of the underneath-lying passage in the direction the coolant flows, wherein the discharge passage discharges the coolant from the underneath-lying passage, and an expulsion passage located between the supply passage and the discharge passage, wherein the expulsion passage expels the coolant to the underneath-lying passage from a vertically lower side toward a vertically upper side.

7. The heat dissipation device according to claim 6, wherein the expulsion passage branches from the supply passage.

8. The heat dissipation device according to claim 6 comprising a plurality of the expulsion passages.

9. The heat dissipation device according to claim 6, wherein the expulsion passage expels the coolant toward a central section of the mounting portion.

10. The heat dissipation device according to claim 1, wherein the coolant passage includes a coolant supply hole and a coolant discharge hole that open in the first surface of the base body.

11. A semiconductor device comprising:

the heat dissipation device according to claim 1;

a metal plate mounted on the mounting portion of the heat dissipation device; and a semiconductor element coupled to the metal plate.

12. The heat dissipation device according to claim 1, wherein the communication passage is one of a plurality of communication passages, and at least one communication passage of the communication passages has an edge aligned with an edge of at least one of the slits.

* * * * *